United States Patent [19]

Höfelt

[11] Patent Number: 4,468,790
[45] Date of Patent: Aug. 28, 1984

[54] SYSTEM FOR THE QUANTIZATION OF SIGNALS

[75] Inventor: Martijn H. H. Höfelt, Eindhoven, Netherlands

[73] Assignee: U.S. Philips Corporation, New York, N.Y.

[21] Appl. No.: 349,233

[22] Filed: Feb. 16, 1982

[30] Foreign Application Priority Data

Mar. 12, 1981 [NL] Netherlands ............... 8101199

[51] Int. Cl.³ .............................. H04B 12/04
[52] U.S. Cl. ..................... 375/30; 333/14; 375/33
[58] Field of Search ............... 332/11 D; 375/28, 30, 375/33, 34, 26; 340/347 DD; 333/14; 455/72, 43; 381/94, 101, 103

[56] References Cited

U.S. PATENT DOCUMENTS 3,573,364  4/1971  Shimamura .................. 375/33
4,099,122  7/1978  Buul ........................ 375/33

Primary Examiner—Benedict V. Safourek
Attorney, Agent, or Firm—Thomas A. Briody; William J. Streeter

[57] ABSTRACT

A system for quantizing signals having a transmitter section and a receiver section interconnected by a transmission path. The transmitter section includes a quantizer, a difference producer, and a filter. An input signal is differenced with a feedback signal, filtered and quantized to produce a first quantized output signal. The first quantized output signal is filtered to produce the feedback signal. The filtered difference signal is further differenced with the quantized output signal to produce a second difference signal which is quantized to produce a second quantized output signal containing the quantizing noise of the first quantized output signal. In the receiver section a first received signal (proportional to the first quantized output signal) is summed with a second received signal (proportional to the second quantized output signal) to produce a sum signal. The first received signal and the sum signal are each filtered and summed to produce a receiver output signal substantially free of quantizing noise.

3 Claims, 9 Drawing Figures

SYSTEM FOR THE QUANTIZATION OF SIGNALS

BACKGROUND OF THE INVENTION

1. Field of the Invention

The invention relates to a system for the quantization of signals comprising a transmitter section and a receiver section, the transmitter section comprising quantizing means, a difference producer and filter means, an input signal and a quantized output signal which is derived from the quantizing means, and functions as a feedback signal being applied to the difference producer and a signal derived from the output signal of the difference producer being applied to the quantizing means, the latter serving to quantize the level of the signal derived from the output signal of the difference producer in a plurality of quantizing levels in order to produce a quantized output signal, filter means being connected in the path of the input signal for relatively influencing the spectrum of the quantizing noise with respect to the spectrum of the input signal.

The invention may be employed in A/D and D/A-conversion and the conversion of a digital format into another digital format (D/D-conversion). Generally, the invention is employed in those signal processing methods in which, as an intermediate step, the number of quantizing levels of a signal is reduced and the sampling rate thereof is increased.

2. Description of the Prior Art

From the publication, IRE Transactions on Communication Systems, December 1962, pages 373–80, (reference D.1), it is known that quantizing noise can be reduced by a combination of feedback around the quantizer and increase of the sampling rate.

It is furthermore known from the publication, IEEE Transactions on Circuits and Systems, July 1978, pages 448–60, (reference D.2) that the ultimate signal-to-noise ratio in a DPCM feedback coder is determined by the noise of the A/D converter and the noise resulting from the threshold inaccuracy of the D/A converter included in the feedback loop. Said latter noise contribution reduces the gain in signal-to-noise ratio which can be achieved by the combination of the feedback around the quantizer and the increase of the sampling rate.

SUMMARY OF THE INVENTION

The invention has for its object to provide a system for the quantization of signals in which, the performances as regards the reduction in quantizing noise remaining the same, the number of quantizing levels of the feedback signal can be reduced.

According to the invention, the system is characterized in that the quantizing means are adapted for providing a second quantized output signal in response to the signal derived from the output signal of the difference producer and that in the receiver section a first received signal which is proportional to the first output signal of the transmitter section is applied to a first network having a first transfer function and a second received signal which is proportional to the second output signal of the transmitter section is applied to a second network having a second transfer function for relatively influencing the spectrum of the second received signal in a manner which is similar to the manner in which the said filter means influences the spectrum of the quantizing noise in the transmitter section and that the output signal of the first network is combined with the output signal of the second network for providing a receiver section output signal the transfer functions of the first and second networks being so determined relative to the transfer function of the transmitter section that on combining received signals the quantizing noise in the first received signal is cancelled by that portion of the quantizing noise in the second received signal which is proportional to the quantizing noise of the first quantized output signal of the quantizing means.

The number of quantizing levels of the feedback signal may in principle amount to two in which case a one-bit D/A-converter may be employed in the feedback loop. A level unbalance may occur during said conversion. The DC-error voltage produced thereby is generally of little importance. Apart from this error voltage the one-bit converter behaves in a faultless manner, which is in contradistinction to multi-bit converters in which furthermore non-linearities may be produced owing to the threshold inaccuracies.

REFERENCES

D1. "Reduction of Quantizing Noise by Use of Feedback," H. A. Spang and P. M. Schultheiss, IRE Transactions on Communications Systems, CS-10, December 1962, pp 373–80.

D2. "Oversampled Lineair Predictive and Noise Shaping Coders of Order N>1," S. K. Tewksbury and R. W. Hallock, IEEE Transactions on Circuits and Systems. Vol CAS-25, No. 7, July 1978, pages 436–47.

D3. "Optimum Design, Performance Evaluation and Inherent Limitations of DPCM Encoders," D. Cyganski and N. J. Krikelis, IEEE Transactions on Circuits and Systems, Vol CAS-25, No. 7, July 1978, pages 448–60.

DEFINITIONS

X, Y, Z, U, V, . . . : are the spectrum functions (Fourier transforms) of time signals; they are at the same time an indication of the relevant signal.

G1, H1, 1/G1', H1', G2, . . . : are transfer functions of networks (filters); they are at the same time an indication of the relevant network.

Q1', Q2, . . . : are the spectrum functions of the quantizing noise: they are at the same time an indication of the relevant quantizer.

Figure 1:
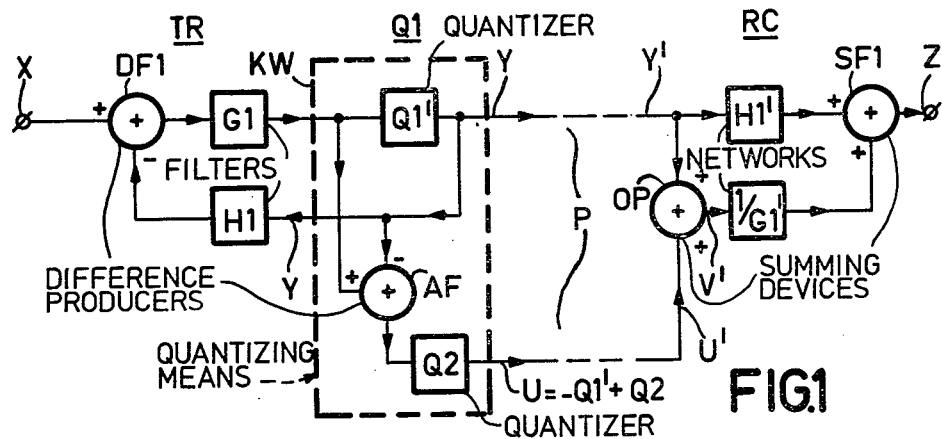
FIG. 1 shows a block schematic circuit diagram of a first system in accordance with the invention.
Figure 2:
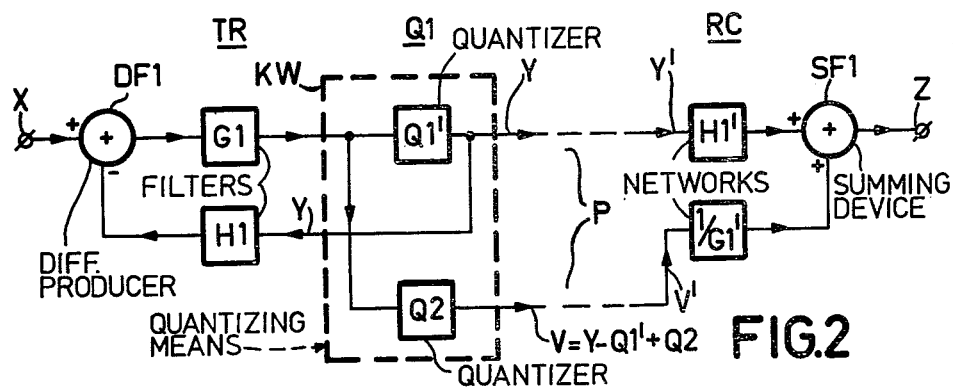
FIG. 2 shows a block schematic circuit diagram of a second system in accordance with the invention.

In FIG. 1 and FIG. 2 it holds that:

$$Y = (G1 \cdot X + Q')/(1 + G1 \cdot H1) \tag{1}$$

$$Z = H1(H1'/H1 - G1/G1') \cdot (G1 \cdot X + Q1')/(1 + G1 \cdot H1) + G1 \cdot X/G1' + Q2/G1' \tag{2}$$

with G1'=G1 and H1'=H1 it holds that:

$$Z = X + Q2/G1. \tag{3}$$

D/A1, . . . : digital-to-analogue converter
A/D1, . . . : analogue-to-digital converter
EC1, . . . : coding portion of an A/D converter
D/D1, . . . : digital-to-digital converter.

DESCRIPTION OF THE PREFERRED EMBODIMENTS

The system Q1, shown in FIG. 1 for quantizing signals comprises a transmitter section TR and a receiver section RC which are interconnected by means of a transmission path P. The transmitter section and the receiver section may be located very near to each other, for example in an integrated implementation on the same chip, or they may be some distance apart. The transmission path P may have any form suitable to transmit a signal Y and a signal U from the transmitter section TR to the receiver section RC. In the receiver section the received signals which are proportional to Y and U are denoted by Y' and U'.

The transmitter section TR comprises quantizing means KW, a difference producer DF1 and filter means in the form of the networks G1 and H1. An input signal X and a quantized output signal Y which is derived from the quantizing means KW and functions as a feedback signal are applied to the difference producer DF1. The output signal of difference producer DF1 is applied by the network G1 to the quantizing means KW which serves to quantize the filtered output signal of the difference producer in a plurality of quantizing levels in order to produce a quantized output signal Y.

The network G1 influences the spectrum of the input signal X relatively with respect to the spectrum of the quantizing noise in the output signal Y of the quantizing means KW. This network G1 has a noise-spectrum shaping action and, as will be apparent from reference D2, there are several possiblities to introduce a noise-shaping network in a feedback quantizing arrangement. The networks H1 and G1 will have to be chosen such that their combination ensures the stability of the feedback loop.

A relative suppression of the quantizing noise by the network G1 by a dB increases the dynamic range by a dB. Expressed in the number of bits required to code the increase of the dynamic range one quantizing step being the unit, that is an increase of the dynamic range by a/6 bits or, for example, 6 bits for a noise suppression of a=36 dB.

The quantizing means KW comprsies a quantizer Q1' servicing to provide the quantized output signal Y. From the expression (1) in the section Definitions it will be clear that for the reproduction of the signal X the signal Y must be passed through a network having the transfer function: H1+1/G1. Accordingly, the receiver section RC comprises a network H1' the input of which is connected in parallel through a summing device OP with the input a network 1/G1', the outputs of these networks being combined through a summing device SF1.

In the receiver section RC a received signal Y' which is proportional to the quantized output signal Y of the transmitter section TR is applied to the input of the network H1' and, through the summing device OP, to the input of the network 1/G1', as a result of which an output signal Z of the receiver section is provided at the output of the summing device SF1 in accordance with the expression (2) in the Definitions if therein, for Q2, Q1' is read for the time being. Under the condition indicated at expression (2), expression (2) reduces to expression (3).

In accordance with the invention, the quantizing means KW comprises a quantizing arrangement Q2 for providing a second quantized output signal U in response to the filtered output signal of difference producer DF1 after the output signal Y of the quantizer Q1' has been in a difference producer AF subtracted. The input signal of the quantizing arrangement Q2 is then exactly the quantizing noise of quantizer Q1'. The output signal U of quantizing arrangement Q2 may be expressed by: U=−Q1'+Q2, that is to say the input signal −Q1' increased by the quantizing noise Q2.

The quantizing arrangement Q2 has been chosen such that it quantizes the applied signal with an accuracy which is greater than the accuracy of the quantizer Q1'. When direct quantization is used, the number of quantizing levels of the quantizing arrangement Q2 may be expressed in, for example, a number of eight bits, while quantizer Q1' is for example, a one-bit quantizer.

In the receiver section RC a second received signal U' which is proportional to the second output signal U of the transmitter section TR is applied to the input of the network 1/G1' via summing device OP. This results at the output of the receiver section in a signal Z which is wholly in accordance with expression (2) and under the conditions indicated there is wholly in accordance with expression (3). From the latter expression it can be seen that the quantizing noise Q1' is not present in the output signal Z. This is a result of the fact that the noise in the signal Y', which depends on the quantizing noise Q1', is compensated for in summing device SF1 by the noise in the signal U' which also depends on the quantizing noise Q1'. In not wholly ideal circumstances in which there may be small differences between the functions H1 and H1' and G1 and G1' an at least significant suppression of the quantizing noise Q1' in the output signal Z is realized.

As a result of the manner of compensation of the quantizing noise Q1' in the output signal Z, described in the foregoing, the quantizing noise contribution in the output signal Z becomes equal to Q2/G1. The quantizing arrangement Q2 has a greater accuracy during quantization than the quantizer Q1' and a correspondingly lower quantizing noise (Q2<Q1'). It will be noted that the compensation of the quantizing noise Q1' offers freedom in the choice of the number of quantizing levels of the quantizer Q1'. This number may even be reduced to two, which results in a very simple embodiment for quantizer Q1'.

FIG. 2 shows a second system Q1 in accordance with the invention, which differs from the system shown in FIG. 1 in inter alia the absence of difference producer AF and summing device OP. A scrutiny of the two figures shows that the same output signal Z is obtained. The input signal V' of the network 1/G1' is the same in both cases.

Figure 3:
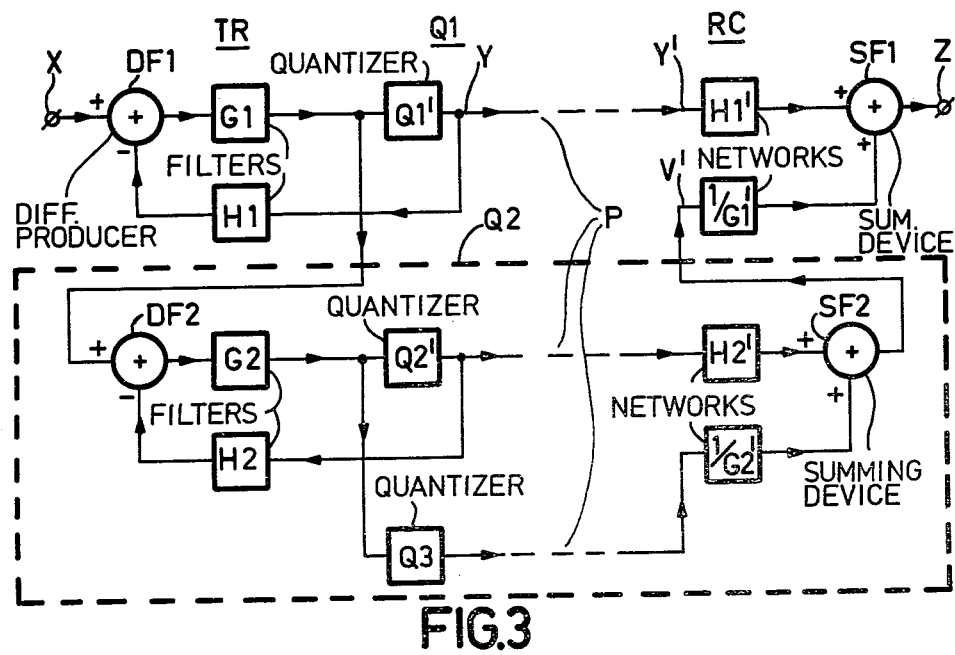
FIG. 3 is a block schematic circuit diagram of a variant of the system shown in FIG. 2, wherein the principle of what is commonly referred to as "nesting" is used.

The system shown in FIG. 3 is derived from the system shown in FIG. 2 by giving the quantizing arrangement Q2 of FIG. 2 itself a construction similar to the system Q1 of FIG. 2. In this way one system (Q2) is nested in the other system (Q1). This nesting can be continued by giving the quantizing arrangement Q3 in system Q2 itself a similar construction as system Q1 of FIG. 2, etc. Continuing in this way results in a cascade of systems Q1, Q2, Q3, etc. In each individual system of the cascade, noise compensation occurs when the conditions mentioned in the foregoing, which hold for the system Q1 of FIG. 2, are also satisfied by the systems Q2, Q3, etc; that is to say, for example for Q2, that H2'=H2 and G2'=G2 etc. When this is extended to (N−1) systems, the quantizing noise in the output signal Z may then be expressed by: QN/G1.G2.G3 ... G(N−1).

The quantizers Q1', Q2', etc in the systems Q1, Q2, etc may each be in the form of a one-bit quantizer; at the same time quantizing arrangement QN in the $(N-1)^{st}$ system of the cascade may be in the form of a system having a feed-back one-bit quantizer QN'. The last system QN of the cascade will comprise in the receiver section RC the networks HN' and 1/GN' with parallel-arranged inputs. In this case the quantizing noise in the output signal Z may be expressed by QN'/G1.G2.G3 ... GN.

Figure 4:
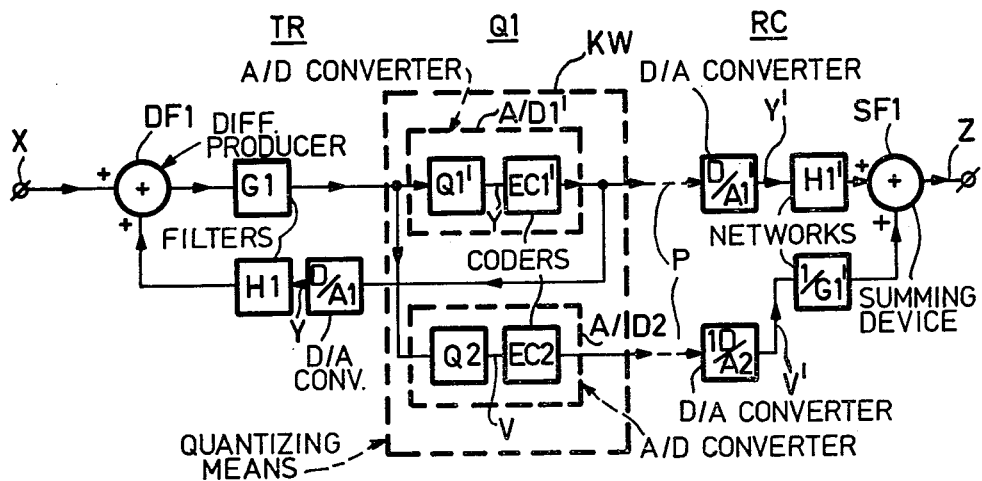
FIG. 4 is a block schematic circuit diagram of a variant of the system shown in FIG. 2 suitable for digital signal transmission between the transmitter section and the receiver section, when the input signal and the output signal are both or must both be analogue signals.

In many applications it will be desirable to code the quantized signals in a digital code in order to make them suitable for transmission over a digital transmission path P. A variant of FIG. 2 which is suitable for digital signal transmission is shown in FIG. 4. A coder EC1' which codes the quantizing level, for example in a binary manner, is added to quantizer Q1'. The quantizer Q1' and the coder EC1' together form an anlaogue-to-digital converter A/D1'. Likewise, quantizer Q2 forms an analogue-to-digital converter A/D2 in combination with coder EC2. A digital-to-analogue converter D/A1 is included in the path of the feed-back signal Y. Into the receiver section RC the D/A-converters D/A1 and 1D/A2 are connected in front of the networks H1' and 1/G1', respectively.

As has already been mentioned in the foregoing, the quantizer Q1' may be in the form of a one-bit quantizer. It is advantageous to opt for this construction, as in that case the D/A-converters D/A1 and D/A1' may be constructed as one-bit converters which do not produce noise which is commonly referred to as threshold inaccuracy noise, as would be the case with multi-bit D/A-converters (reference D3). The noise contribution of D/A-converter 1D/A2 will be reduced by the network 1/G1' and plays a lesser part than the noise contributions of the converters D/A1 and D/A1'.

The principle of what is commonly referred to as nesting may also be used for the system Q1 of FIG. 4 by giving the system comprising the A/D-converter A/D2 and the D/A-converter 1D/A2 itself the same construction as the system Q1 shown in FIG. 4. In this way the system of FIG. 5 is derived from the system shown in FIG. 4.

Figure 6:
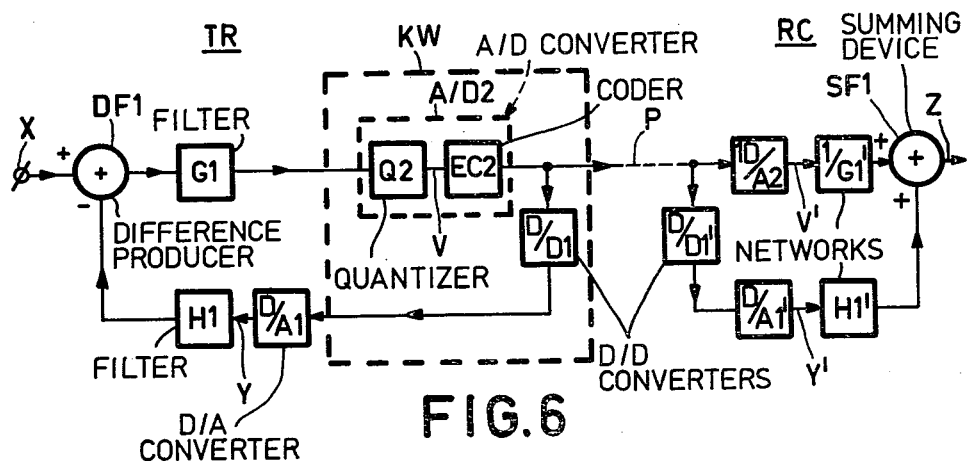
FIG. 6 is block schematic circuit diagram of a variant of the system shown in FIG. 4.

When a direct quantizing arrangement Q2 is used having more quantizing levels than the quantizer Q1 it is possible to derive the feedback signal Y in the system shown in FIG. 4 from the output signal of A/D-converter A/D2, as is illustrated in FIG. 6. In this embodiment of the system of FIG. 4 a digital-to-digital converter D/D1 is arranged between the output of A/D-converter A/D2 and the input of D/A-converter D/A1. This D/D-converter converts each output code word of A/D-converter A/D2 into a code word having less bits. The quantizing levels of the quantizer Q1' simulated in this manner then form a subclass of the quantizing levels of quantizing arrangement Q2, for example only the sign bit of the code word is maintained. This corresponds to the case in which the simulated quantizer Q1' is a one-bit quantizer.

In the receiver section RC an identical D/D-converter D/D1' is arranged between the transmission path P and the input of D/A-converter D/A1'. This D/D-converter has here the same function as the D/D-converter D/D1 in the transmitter section TR, which results in a signal Y' which is proportional to the feedback signal Y being applied to the network H1'.

Figure 5:
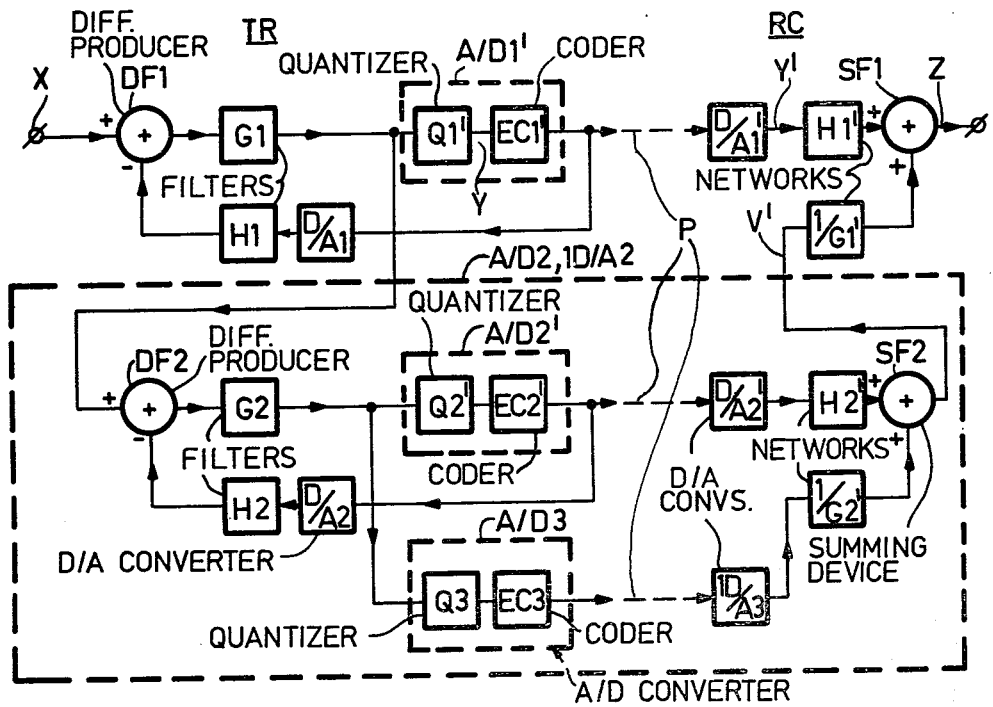
FIG. 5 shows a block schematic circuit diagram of a variant of the system shown in FIG. 3 suitable for digital transmission between the transmitter section and the receiver section, when the input signal and the output signal are both or must both be analogue signals.
Figure 7:
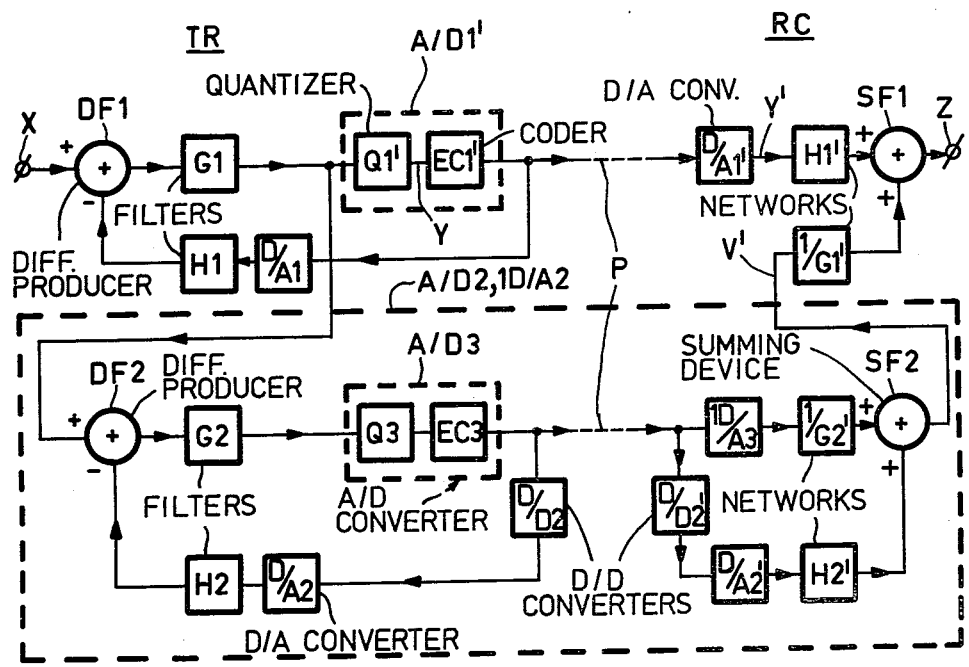
FIG. 7 is a block schematic circuit diagram of a variant of the system shown in FIG. 5.

That portion of the system of FIG. 5 which is within the block (enclosed by a dashed line): A/D2, 1D/A2 may be constructed as the system shown in FIG. 6. Such a construction of the system in accordance with FIG. 5 is illustrated in FIG. 7.

Figure 8:
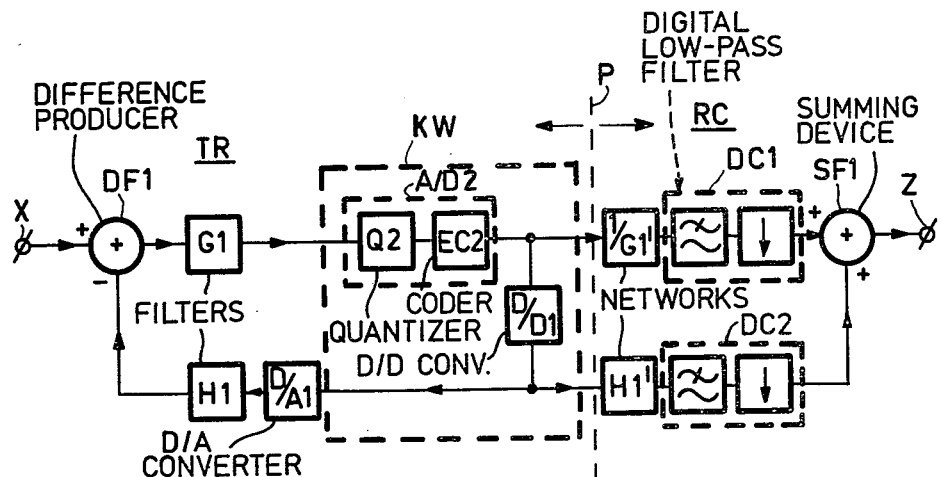
FIG. 8 is a block schematic circuit diagram of an anlogue-to-digital converter arrangement in which a system in accordance with the invention is employed.

The system in accordance with the invention may be employed in an analogue-to-digital converter arrangement. An embodiment of such a converter, which is based on the system of FIG. 6, is shown in FIG. 8, the differences being inter alia that the converters D/A1', 1D/A2 and D/D1' have been omitted. The output signal of converter D/D1 is here directly applied to the input of the network H1'.

In order to realize suppression of the quantizing noise in a predetermined frequency band it will be necessary to choose for the sampling rate of the signal a rate which is greater than the minimum value required on the basis of the sampling theorem (reference D1). The decimating digital low-pass filters DC1 and DC2 have for their object to reduce the sampling rate to a predetermined desired value, for example to the standard value of 8 kHz. The converter A/D2 may have, for example, a sampling rate of 128 kHz.

Figure 9:
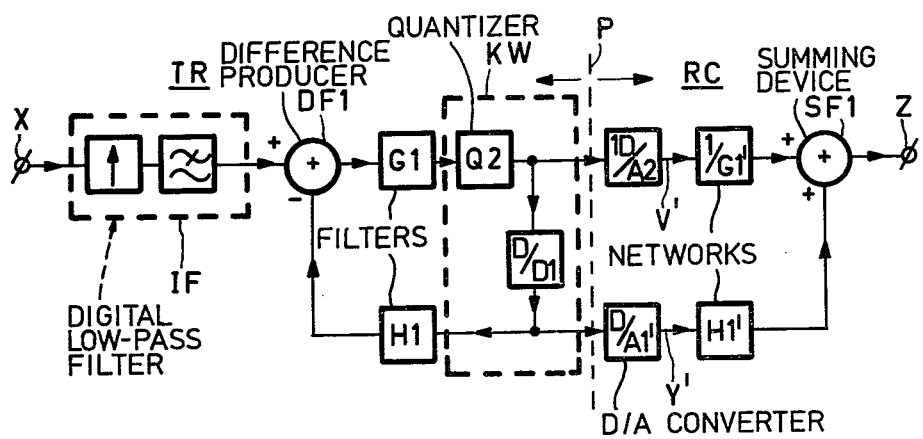
FIG. 9 is a block schematic circuit diagram of a digital-to-analogue converter arrangement in which a system in accordance with the invention is employed.

The system in accordance with the invention may alternatively be used in a digital-to-analogue converter arrangement. An embodiment of such a converter which is based on the system shown in FIG. 6 is shown in FIG. 9. The differences compared with FIG. 6 are inter alia the omission of the coder EC2 and the converters D/A1 and D/D1'. The output signal of converter D/D1 is here directly applied to the input of the converter D/A1'. In this case the quantizer Q2 is a fully digital quantizer and may be in the form of a D/D-converter.

An interpolating digital low-pass filter IF which serves to increase the sampling rate is connected between the input for the input signal X and the corresponding input of the (digital) difference producer DF1. The input signal has, for example, the standard sampling rate of 8 kHz for speech, while the system further operates with a sampling rate of 128 kHz.

The system in accordance with the invention may alternatively be used in a digital-to-digital converter arrangement. A converter arrangement of this type may simply be based on the converter arrangement shown in FIG 9 by omitting the converters D/A1' and 1D/A2 therefrom.

By way of illustration, with reference to FIG. 9, the following illustrative data is given:

$$H1 = \sum_{n=1}^{2} a_n z^{-n}$$

$$1/G1 = \sum_{n=0}^{2} b_n z^{-n}$$

$$H1 = 1 - 1/G1$$

$a_1 = 1.098$ } zero of $H1$ at 48 kHz
$a_2 = -0.677$
$b_0 = 1$
$b_1 = -1.982$ } poles of $G1$ at 11.5 kHz quality factor: 22)
$b_2 = 0.9949$ $Q2$: $M$-bits quantizer ($M=8$)
$D/D1$: $M$-to one bit converter.

IF: corner frequency 20 kHz
output sampling rate $2^R \cdot 40$ kHz ($R=4$)
SQNR: $6M+15R-18.5$ dB, at the output of the receiver section RC (SQNR=signal-to-quantizing noise ratio).

What is claimed is:

1. In a system for the quantization of signals having a transmitter section and a receiver section, the transmitter section having quantizing means, a difference producer and filter means, wherein an input signal and a first quantized output signal which is derived from the quantizing means and functions as a feedback signal are applied to the difference producer, and a signal derived from the output signal of the difference producer is applied to the quantizing means, the latter serving to quantize the level of the signal derived from the output signal of the difference producer in a plurality of quantizing levels in order to produce said first quantized output signal, filter means being connected in the path of the input signal for relatively influencing the spectrum of the quantizing noise with respect to the spectrum of the input signal, the improvement comprising said quantizing means being adapted for providing a second quantized output signal in response to the signal derived from the output signal of the difference producer and the receiver section comprising a first network having a first transfer function and having applied thereto a first received signal which is proportional to the first output signal of the transmitter section, a second network having a second transfer function for relatively influencing the spectrum of a second received signal which is proportional to the second output signal of the transmitter section applied thereto, said second network influencing the spectrum of said second received signal in a manner which is similar to the manner in which the said filter means influences the spectrum of the quantizing noise in the transmitter section, summing means for combining the output signal of the first network with the output signal of the second network to provide a receiver section output signal, the transfer functions of the first and second networks being so determined relative to the transfer function of the transmitter section that on combining the received signals the quantizing noise in the first received signal is cancelled by that portion of the quantizing noise in the second received signal which is proportional to the quantizing noise of the first quantized output signal of the quantizing means.

2. The invention according to claim 1 wherein the quantizing means comprises a first quantizer (Q1') from which is derived the first quantized output signal, a second difference producer (AF) connected to the input and to the output of the first quantizer (Q1'), a second quantizer (Q2) connected to the output of the second difference producer, the latter serving to quantize the level of the signal derived from the output of the second difference producer in order to produce the second quantized output signal.

3. The invention according to claim 2 wherein the second quantizer (Q2) quantizes the applied signal with an accuracy that is greater than the accuracy of the first quantizer (Q1').

* * * * *